(12) United States Patent
Hou et al.

(10) Patent No.: US 8,372,945 B2
(45) Date of Patent: Feb. 12, 2013

(54) CONJUGATED POLYMERS WITH CARBONYL SUBSTITUTED THIENO[3,4-B]THIOPHENE UNITS FOR POLYMER SOLAR CELL ACTIVE LAYER MATERIALS

(75) Inventors: Jianhui Hou, El Monte, CA (US); Shaoqing Zhang, El Monte, CA (US)

(73) Assignee: Solarmer Energy, Inc., El Monte, CA (US)

( * ) Notice: Subject to any disclaimer, the term of this patent is extended or adjusted under 35 U.S.C. 154(b) by 697 days.

(21) Appl. No.: 12/509,359

(22) Filed: Jul. 24, 2009

(65) Prior Publication Data

US 2011/0017956 A1 Jan. 27, 2011

(51) Int. Cl.
*C08G 75/00* (2006.01)
(52) U.S. Cl. .......................... 528/377; 528/380
(58) Field of Classification Search .................. 528/377, 528/380
See application file for complete search history.

(56) References Cited

U.S. PATENT DOCUMENTS

| | | |
|---|---|---|
| 3,589,946 A | 6/1971 | Tameja et al. |
| 4,060,426 A | 11/1977 | Zinchuk |
| 4,104,084 A | 8/1978 | Evans, Jr. |
| 4,252,573 A | 2/1981 | Boer et al. |
| 4,400,868 A | 8/1983 | Antypas et al. |
| 4,528,082 A | 7/1985 | Moustakas et al. |
| 4,543,443 A | 9/1985 | Moeller et al. |
| 4,574,160 A | 3/1986 | Cull et al. |
| 4,586,988 A | 5/1986 | Nath et al. |
| 4,590,327 A | 5/1986 | Nath et al. |
| 4,595,790 A | 6/1986 | Basol |
| 4,647,711 A | 3/1987 | Basol et al. |
| 4,663,495 A | 5/1987 | Berman et al. |
| 4,675,468 A | 6/1987 | Basol et al. |
| 4,680,422 A | 7/1987 | Stanbery |
| 4,686,323 A | 8/1987 | Biter et al. |

(Continued)

FOREIGN PATENT DOCUMENTS

| | | |
|---|---|---|
| EP | 0949850 | 10/1999 |
| GB | 2308182 | 6/1997 |

(Continued)

OTHER PUBLICATIONS

Yang et al., Advanced Mat., 2007, 19, 3979-3983.*

(Continued)

*Primary Examiner* — Shane Fang
(74) *Attorney, Agent, or Firm* — Hema Vakharia-Rao; Nixon Peabody LLP

(57) ABSTRACT

In one embodiment of the present disclosure, a series of conjugated polymers used, among other things, as polymer solar cell or polymer photovoltaic device active layer materials, is provided. In one embodiment, the conjugated polymers have the general structure and formula shown in (I), wherein: R1 and R2 are independently selected from proton, halogens, alkyls, aryls and substituted aryls; Ar is selected from the group consisting of monocyclic, bicyclic and polycyclic arylene, or monocyclic, bicyclic and polycyclic heteroarylene. In another embodiment, the conjugated photovoltaic polymers are comprised of repeated units having the general structure of formula (II), wherein, R1, R2, R3, R4, R5, and R6 are independently selected from proton, alkyls, halogens, aryls, substituted aryls, and other kinds of substituents. Synthesis methods of several polymers of the present disclosure are provided, and absorption spectra and electrochemical cyclic voltammetry data of some polymers, and also the photovoltaic properties of the polymers in this present disclosure are also provided.

17 Claims, 1 Drawing Sheet

U.S. PATENT DOCUMENTS

| | | | |
|---|---|---|---|
| 4,695,674 A | 9/1987 | Bar-on |
| 4,808,242 A | 2/1989 | Murata et al. |
| 4,865,999 A | 9/1989 | Xi et al. |
| 5,069,727 A | 12/1991 | Kouzuma et al. |
| 5,133,810 A | 7/1992 | Morizane et al. |
| 5,176,758 A | 1/1993 | Nath et al. |
| 5,181,968 A | 1/1993 | Nath et al. |
| 5,288,338 A | 2/1994 | Morikawa |
| 5,298,086 A | 3/1994 | Guha et al. |
| 5,331,183 A | 7/1994 | Sariciftci et al. |
| 5,458,694 A | 10/1995 | Nuyen |
| 5,479,043 A | 12/1995 | Nuyen |
| 5,723,873 A | 3/1998 | Yang |
| 5,797,998 A | 8/1998 | Wenham et al. |
| 5,942,048 A | 8/1999 | Fujisaki et al. |
| 6,121,542 A | 9/2000 | Shiotsuka et al. |
| 6,278,055 B1 | 8/2001 | Forrest et al. |
| 6,297,495 B1 | 10/2001 | Bulovic et al. |
| 6,320,117 B1 | 11/2001 | Campbell et al. |
| 6,352,777 B1 | 3/2002 | Bulovic et al. |
| 6,420,031 B1 | 7/2002 | Parthasarathy et al. |
| 6,469,437 B1 | 10/2002 | Parthasarathy et al. |
| 6,509,204 B2 | 1/2003 | Campbell |
| 6,515,030 B1 | 2/2003 | Bechtel et al. |
| 6,538,194 B1 | 3/2003 | Koyanagi et al. |
| 6,657,378 B2 | 12/2003 | Forrest et al. |
| 6,913,943 B2 | 7/2005 | Cunningham et al. |
| 6,936,761 B2 | 8/2005 | Pichler |
| 7,022,910 B2 | 4/2006 | Gaudiana et al. |
| 7,105,237 B2 | 9/2006 | Sotzing |
| 7,163,831 B2 | 1/2007 | Hasegawa et al. |
| 7,183,418 B2 | 2/2007 | Heeney et al. |
| 7,332,223 B2 | 2/2008 | Sotzing et al. |
| 7,737,356 B2 | 6/2010 | Goldstein |
| 2002/0009015 A1 | 1/2002 | Laugharn |
| 2004/0099307 A1 | 5/2004 | Sun |
| 2004/0113546 A1 | 6/2004 | Forrest et al. |
| 2004/0265623 A1 | 12/2004 | Stegamat et al. |
| 2005/0074629 A1 | 4/2005 | Forrest et al. |
| 2005/0082525 A1 | 4/2005 | Heeney et al. |
| 2005/0126629 A1 | 6/2005 | Okada et al. |
| 2005/0150543 A1 | 7/2005 | Nakashima et al. |
| 2005/0164019 A1 | 7/2005 | Liu et al. |
| 2005/0205127 A1 | 9/2005 | Watanabe et al. |
| 2005/0209419 A1 | 9/2005 | Zahn et al. |
| 2005/0260777 A1 | 11/2005 | Brabec et al. |
| 2005/0268962 A1 | 12/2005 | Gaudiana et al. |
| 2005/0275340 A1 | 12/2005 | Choi et al. |
| 2006/0000506 A1 | 1/2006 | Brabee et al. |
| 2006/0065301 A1 | 3/2006 | Miyoshi |
| 2006/0071200 A1 | 4/2006 | Nordquist et al. |
| 2006/0090791 A1 | 5/2006 | Gaudiana et al. |
| 2006/0141662 A1 | 6/2006 | Brabec et al. |
| 2006/0234065 A1 | 10/2006 | Ohno et al. |
| 2006/0292736 A1 | 12/2006 | Lee et al. |
| 2007/0000537 A1 | 1/2007 | Leidholm et al. |
| 2007/0028959 A1 | 2/2007 | Lee et al. |
| 2007/0044836 A1 | 3/2007 | Forrest et al. |
| 2007/0068569 A1 | 3/2007 | Nam et al. |
| 2007/0079869 A1 | 4/2007 | Yukinobu |
| 2007/0095389 A1 | 5/2007 | Cho et al. |
| 2007/0095391 A1 | 5/2007 | Sun |
| 2007/0131277 A1 | 6/2007 | Gaudiana et al. |
| 2007/0178619 A1 | 8/2007 | Forrest et al. |
| 2007/0181179 A1 | 8/2007 | Brabec et al. |
| 2007/0184576 A1 | 8/2007 | Chang et al. |
| 2007/0186971 A1 | 8/2007 | Lochun et al. |
| 2007/0190789 A1 | 8/2007 | Carter et al. |
| 2007/0193621 A1 | 8/2007 | Brabec et al. |
| 2007/0193622 A1 | 8/2007 | Sai |
| 2007/0215879 A1 | 9/2007 | Liu et al. |
| 2007/0216300 A1 | 9/2007 | Lee et al. |
| 2007/0235074 A1 | 10/2007 | Henley et al. |
| 2007/0246704 A1 | 10/2007 | Heeney et al. |
| 2007/0251570 A1 | 11/2007 | Eckert et al. |
| 2007/0267055 A1 | 11/2007 | Gaudiana et al. |
| 2007/0272296 A1 | 11/2007 | Brabec et al. |
| 2007/0295387 A1 | 12/2007 | Adriani et al. |
| 2008/0006324 A1 | 1/2008 | Berke et al. |
| 2008/0029147 A1 | 2/2008 | Yang et al. |
| 2008/0102559 A1 | 5/2008 | Ong et al. |
| 2008/0103286 A1 | 5/2008 | Ong et al. |
| 2009/0223079 A1 | 9/2009 | Myong |
| 2009/0229667 A1 | 9/2009 | Shrotryia et al. |
| 2009/0269621 A1 | 10/2009 | Lifka et al. |
| 2010/0018581 A1 | 1/2010 | Shrotryia et al. |
| 2010/0078074 A1 | 4/2010 | Yang et al. |
| 2010/0276071 A1 | 11/2010 | Li et al. |
| 2010/0290879 A1 | 11/2010 | Wu et al. |
| 2011/0008926 A1 | 1/2011 | Irvin et al. |
| 2011/0124822 A1 | 5/2011 | Yu et al. |

FOREIGN PATENT DOCUMENTS

| | | |
|---|---|---|
| JP | 2005206750 | 8/2005 |
| WO | WO 93-21662 | 10/1993 |
| WO | WO 2004-112161 | 12/2004 |
| WO | WO 2006-133265 | 12/2006 |
| WO | WO 2007-005617 | 1/2007 |
| WO | WO 2007-070395 | 6/2007 |
| WO | WO 2008-011957 | 1/2008 |
| WO | WO 2008-016691 | 2/2008 |
| WO | WO 2009 114832 | 9/2009 |
| WO | WO 2011-057191 | 5/2011 |

OTHER PUBLICATIONS

Liang et al., JACS 2009,131, 7792-7799.*
Liang et al., JACS 2009,131, 56-67.*
Szarko et al., Proc. Of SPIE 7034,703403, 2008.*
Office Action for U.S. Appl. No. 12/179,387, dated Mar. 7, 2011.
International Search Report for International Application No. PCT/US2009/037197, dated Oct. 29, 2009.
International Search Report for International Application No. PCT/US2010/055829, dated Jan. 10, 2011.
International Preliminary Examination Report for International Application No. PCT/US2009/037197, dated Sep. 23, 2010.
Office Action for U.S. Appl. No. 12/179,387, dated Jul. 12, 2010, 10 pages.
Office Action for U.S. Appl. No. 12/049,252, dated May 27, 2010, 33 pages.
Office Action for U.S. Appl. No. 12/049,252, dated Dec. 1, 2009, 25 pages.
Office Action for U.S. Appl. No. 12/049,252, dated Dec. 27, 2010, 40 pages.
J. Huang, et al., "Achieving High-Efficiency Polymer White-light-Emitting Devices", Advanced Materials 2006, vol. 18, pp. 114-117.
G. Li, et al., "High-Efficiency Solution Processable Polymer Photovoltaic Cells by Self-Organization of Polymer Blends", Nature Materials, Nov. 2005, vol. 4, pp. 864-868.
V. Shrotriya, et al., "Efficient light Harvesting in Multiple-Device Stacked Structure for Polymer Solar Cells", Applied Physics Letters 88,064104, 2006.
V. Shrotriya, et al., "Transition Metal Oxides as the Buffer Layer for Polymer Photovoltaic Cells", Applied Physics Letters 88, 073508, 2006.
G. Li, et al., "Efficient Inverted Polymer Solar Cells", Applied Physics Letters 88, 253503, 2006.
C. Chu, et al., "Integration of Organic light-Emitting Diode and Organic Transistor Via a Tandem Structure", Applied Physics Letters 86, 253503, 2005.
H. Liao, et al., "Highly Efficient Inverted Polymer Solar Cell by Low Ternmperature Annealing of CS2CO3 Interlayer", Applied Physics Letters 92,173303, 2008.
V. Shrotriya, et al., Translucent Plastic Solar Cells—Novel Devices and Their Applications, Conference, USA 2007.
Office Action for U.S. Appl. No. 12/499,460, dated Jan. 21, 2011, 9 pages.
Li et al., Manipulating regioregular poly(3-hexylthiophene) : [6,6]-phenyl-C61-butyric acid methyl ester blends-route towards high efficiency polymer solar cells, J. Mater. Chem., 2007, vol. 17, pp. 3126-3140.
PCT Search Report and Written Opinion mailed Sep. 15, 2010 for PCT/US10/42794.

Stephen R. Forrest "The path to ubiquitous and low-cost organic electronic appliances on plastic", Nature 2004, 428, pp. 911-918.

International Search Report for PCT/US2009/55717, dated Apr. 1, 2010.

International Search Report for PCT/US2009/044364, dated Aug. 27, 2009.

Shiraishi et al. "New p-conjugated polymers constituted of dialkoxybenzodithiophene units: synthesis and electronic properties" Synthetic Metals 130 (2002) 139-147.

Zhenan Bao et al. "Organic field-effect transistors with high mobility based on copper phthalocyanine", Appl. Phys. Lett. 69 (20), pp. 3066-3068, Nov. 11, 1996.

Peter Beimling et al. "Synthesis of Benzo [1,2-b: 4,5-b] dithiophene and its 4,8-Dimethoxy and 4,8-Dimethyl Deiratives" Chem. Ber. 119, 3198-3203, 1986.

Martin R. Bryce et al. "Formation and Rearrangement of Adducts from Benzyne and Substituted 2, 1,3-Benzoselenadiazoles" J. Chem. Soc. Perkin Trans. 1, 607-613, 1981.

Tian-An Chen et al. "Polyalkylthiophenes with the smallest bandgap and the highest intrinsic conductivity" Synthetic Metals, 60 (1993) 175-177.

Chien-Tien Chen et al. "Doubly Ortho-Linked Quinoxaline/Diphenylfluorene Hybrids as Bipolar, Fluorescent Chameleons for Optoelectronic Applications", J. Am. Chem. Soc. 2006, 128, 10992-10993.

Stephen R. Forrest Organic electronics are beginning to make significant inroads into the commercial world, and if the field continues to progress at its current, rapid pace, electronics based on organic thin-film materials will soon become mainstay of our technological existence. Already products based on active thin-film organic devices are in the market place, most notably the displays of several mobile electronic appliances. Yet the future holds even greater promise for this technology, with an entirely new generation of ultralow-cost, lightweight and even flexible electronic devices in the, publishing date 2004.

Robin G. Hicks et al. "Synthesis and Electronics Structure Investigation of α,w-Bis(arylthio)oligothiophenese: Toward Understanding Wire-Linker Interactions in Molecular-Scale Electronic Materials", J. Chem. Soc., 122, 6746-6753, 2000.

Jianhui Hou et al. "Synthesis and Photovoltaic Properties of Two-Dimensional Conjugated Polythiophenes with Bi (thienylenevinylene) Side Chains", J. Am. Chem. Soc. 2006, 128, pp. 4911-4916.

Jianhui Hou et al. "Branched Poly(thienylene vinylene)s with Absorption Spectra Covering the Whole Visible Region", Macromolecules, 39, 4657-4662, 2006.

Ahmed Iraqi et al, "Synthesis and characterisation of telechelic regioregular head-to-tail poly (3-alkylthiophenes)" 1998.

Don D. Kenning et al. "Thieno[3,4-b]pyrazines: Synthese, Structure, and Reactivity", J. Org. Chem. 2002, 67, pp. 9073-9076.

Yongfang Li et al. "Electrochemical properties of luminescent polymers and polymer light-emitting electrochemical cells", Synthetic Metals 99 (1999) pp. 243-248.

Robert S. Loewe et al. "Regioregular, Head-to-Tail Coupled Poly (3-alkylthiophenes) Made Easy by the GRIM Method: Investigation of the Reaction and the Origin of Regioselectivity", Macromolecules 2001, 34, pp. 4324-4333.

L. P. Ma et al. "Organic electrical bistable devices and rewritable memory cells", Applied Physics Letters, vol. 80 No. 16, Apr. 22, 2002, pp. 2997-2999.

Fabiana S. Mancilha et al. Are Molecular 5, 8-n-Extended Quinoxaline Derivaties Good Chromophores for Photoluminescence Applications?, Eur. J. Org. Chem. 2006, pp. 4924-4933.

Richard D. McCullough et al. Enhanced Electrical Conductivity in Regioselectively Synthesized Poly (3-alkylthiophenes), J. Chem. Soc., Chem. Commun., 1992, pp. 70-72.

Norio Miyaura et al. "Palladium-Catalyzed Cross-Coupling Reactions of Organoboron Compounds", Chem. Rev. 1995, 95, pp. 2457-2483.

Hualong Pan et al. "Low-Temperature, Solution-Processed, High-Mobility Polymer Semiconductor for Thin-Film Transistors", J. Am. Chem. Soc. 2007,129, pp. 4112-4113.

C.W. Tang et al. "Organic electroluminescent diodes," Appl. Phys. Lett. 51 (12), Sep. 21, 1987, pp. 913-915.

C.W. Tang et al. "Two-layer organic photovoltaic cell", Appl. Phys. Lett. 48 (2), 183, Jan. 3, 1986.

Hou et al. Bandgap and Molecular Energy Level Control of Conjugated Polymer Photvoltaic Materials Based on Benzo [1,2-b:4,5-b]dithiophene, Macromolecules, vol. 41, No. 16, 2008.

Shahid, "Novel Thieno[3,4-b]pyrazine Based n-Conjugated Polymers for Optoelectronic Devices" Friedrich-Schiller-Universitat, Jena, Aug. 2006.

Liang, Y.; Xiao, S.; Feng, D.; Yu L. "Control in Energy Levels of Conjugated Polymers for Photovoltaic Application," J. Phys. Chem. C., 2008, 112, 7866-7871.

* cited by examiner

CONJUGATED POLYMERS WITH CARBONYL SUBSTITUTED THIENO[3,4-B]THIOPHENE UNITS FOR POLYMER SOLAR CELL ACTIVE LAYER MATERIALS

BACKGROUND

The present disclosure relates generally to conjugated polymers. More specifically, the present disclosure relates to a class of conjugated photovoltaic polymers, which among other things, are useful as active layer materials in polymer solar cell or polymer photovoltaic devices and the like.

SUMMARY

Conjugated polymers are polymers containing $\tilde{\pi}$-electron conjugated units along the main chain. These polymers can be used as the active layer material of some kinds of photon-electronic devices, such as polymer light emission devices, polymer solar cells, polymer field effect transistors, and the like. As a polymer solar cell material, conjugated polymers should ideally possess certain properties. These properties are high mobility, good harvest of sunlight, good processability, and proper molecular energy level. Some conjugated polymers have proved to be good solar cell materials. For example, some derivatives of poly(p-phenylene vinylene), such as MEH-PPV and MDMO-PPV, and some derivatives of poly(3-alky-thiophene), such as P3HT and P3OT, and some conjugated polymers with heterocyclic aromatic rings, such as poly[2,6-(4,4-bis-(2-ethylhexyl)-4H-cyclopenta[2,1-b;3,4-b']-dithiophene)-alt-4,7-(2,1,3-benzothiadiazole)] (PCP-DTBT), have successfully been used as photo-active layer materials.

Poly[4,8-dialkyl-benzo[1,2-b:4,5-b']dithiophene-2,6-diyl-alt-2,3-substituted-thieno[3,4-b]thiophene-4,6-diyl] is a class polymeric materials in the application of polymer solar cells. These polymers have shown excellent photovoltaic properties. When the substituent as 2-position of the thieno[3,4-b]thiophene was selected from ester, amide, cyano, alkyl, polyfluoroalkyl, polychloroalkyl, aryl, or heteroaryl, the polymers will be a class of potential materials in polymer solar cells.

In another example, the band gap and molecular energy of benzo[1,2-b:4,5-b']dithiophene-based polymers can be tuned effectively by copolymerizing with different conjugated units, such as ethylenedioxy-thiophene-2,5-diyl, thieno[3,4-b]pyrazine-2,5-diyl, benzo[c][1,2,5]selenadiazole-4,7-diyl, and benzo[c][1,2,5]thiadiazole-4,7-diyl, and the substituted benzo[1,2-b:4,5-b']dithiophene can be copolymerized with different conjugated units, including thieno[3,4-b]thiophene, benzo[c][1,2,5]thiadiazole, and other kinds of heteroarylene. From this, it can be concluded that the molecular energy, band gap, and hence photovoltaic properties of poly[benzo[1,2-b:4,5-b']dithiophene-2,6-diyl-alt-thieno[3,4-b]thiophene-4,6-diyl]-based conjugated polymers can be tuned by changing the substituent's. However, it is hard to say that what kind of substituent will have positive effects on photovoltaic properties of poly[benzo[1,2-b:4,5-b']dithiophene-2,6-diyl-alt-thieno[3,4-b]thiophene-4,6-diyl]-based conjugated polymers.

In order to improve the photovoltaic properties of thieno[3,4-b]thiophene-4,6-diyl]-based conjugated polymers, we investigated different substituent's on 2-position of the thieno[3,4-b]thiophene units of the polymer and found that the thieno[3,4-b]thiophene-4,6-diyl]-based conjugated polymers with carbonyl groups on 2-position units exhibited excellent photovoltaic properties.

The present disclosure provides a family of conjugated polymers useful in photovoltaic devices including polymer photodetector devices and polymer solar cell devices, and the general structure of such polymers is shown in formula (I).

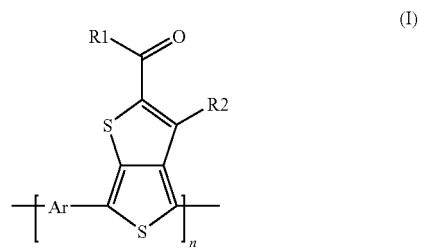

wherein: R1 and R2 are independently selected from a proton, halogens, alkyls, substituted alkyls, amino, N-substituted amino groups, aryls and substituted aryls; Ar is selected from the group consisting of ethenylene, or ethynylene, or monocyclic, bicyclic and polycyclic arylenes, or monocyclic, bicyclic and polycyclic heteroarylenes, or unit being comprised of two or more compounds choosing from ethenylene, ethynylene, or monocyclic, bicyclic and polycyclic arylene, or monocyclic, bicyclic and polycyclic heteroarylenes.

It is another object of the present disclosure to provide polymer solar cell devices containing one or several polymers of the present disclosure as photovoltaic material.

In one embodiment, the conjugated photovoltaic polymers are comprised of repeated units having the general structure of formula (II)

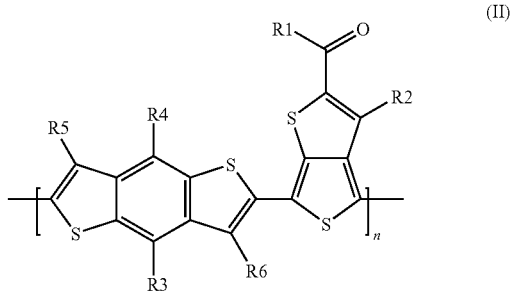

wherein: R1 is selected from proton, alkyls, substituted alkyls, aryls, substituted aryls; R2, R3, R4, R5 and R6 are selected independently from proton, alkyls, substituted alkyls, alkoxyls, substituted alkoxyls, halogens, aryls, substituted aryls.

In another embodiment, R5 and R6 are protons; R3, R4 and R1 are selected independently from alkyls, substituted alkyls, alkoxyls, substituted alkoxyls, aryls, substituted aryls.

In yet another embodiment, photovoltaic devices are provided that contain a polymer of the present disclosure as the photovoltaic material. In yet other embodiments, it is desirable to incorporate fullerene or its derivatives or other additives into the polymer for use in photovoltaic devices. These devices include photodetector devices and polymer solar cell devices. In yet another embodiment, a polymer solar cell device prepared with a polymer of the present disclosure is a bulk-heterojunction photovoltaic device.

Carbonyl group substituted polymers can be readily prepared. Results indicated that carbonyl groups of the thieno[3,4-b]thiophene-4,6-diyl]-based conjugated polymers improve photovoltaic properties, especially in obtaining higher open circuit voltage, and as a result, a power conversion efficiency of 7.7% with an open circuit of 0.78V and a short circuit current of 15 mA has been achieved by using one of the 2-carbonyl-thieno[3,4-b]thiophene-4,6-diyl] contained conjugated polymers as the electron donor material in the active layer of polymer solar cells.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Definitions and Nomenclature

Figure 1:
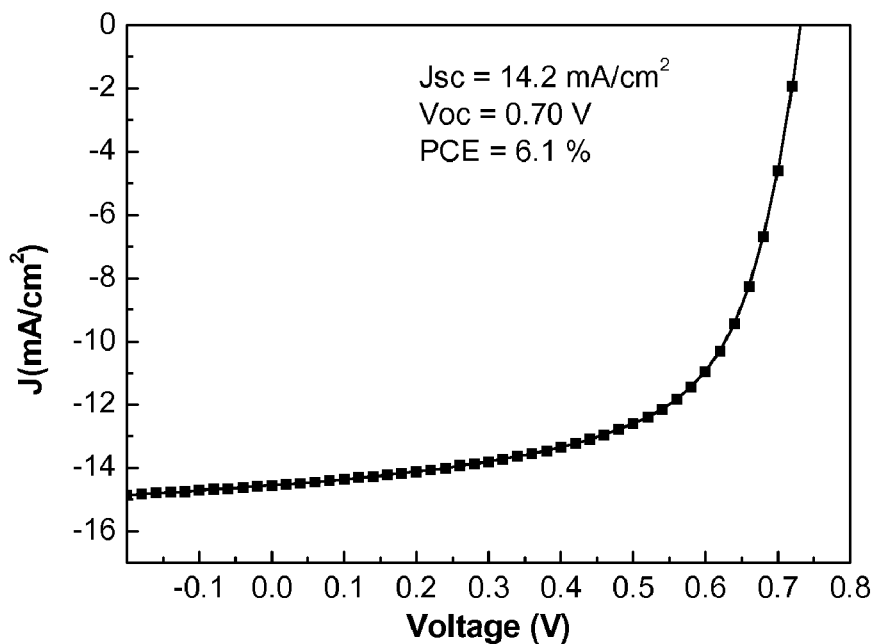
FIG. 1 is an I-V curve of a polymer solar cell in accordance with the present disclosure. with a structure of ITO/PEDOT:PSS/poly[4,8-bis(2-ethylhexoxy)-benzo[1,2-b:4,5-b']dithiophene-2,6-diyl-alt-2-(2-ethylhexanoyl)thieno[3,4-b]thiophene-4,6-diyl] (PBDTTT)/PCBM (1:1.5 wt/wt)/Ca/Al.

Unless otherwise indicated, the present disclosure is not limited to specific starting materials, regents or reaction conditions, as such may vary.

The term "alkyl" as used herein refers to a branched or unbranched saturated hydrocarbon group typically although not necessarily containing 1 to 24 carbon atoms, such as methyl, ethyl, n-propyl, isopropyl, n-octyl, isooctyl, decyl, and the like, as well as cycloalkyl groups such as cyclopentyl, cyclohexyl and the like.

The term "heteroarylene" as used herein refers to a hydrocarbon arylene in which one or more carbon atoms are replaced with a "heteroatom" other than carbon, e.g., nitrogen, oxygen, sulfur, silicon, selenium, phosphorus.

The term "N-containing heteroarylene" as used herein refers to a heteroarylene in which one or more "heteroatom" defined above are nitrogen atoms.

The term "substituted" as in "substituted alkyl", "substituted arylene", "substituted heteroarylene", and the like, is meant that in the arylene or heteroarylene, or other moiety, at least one hydrogen atom bound to a carbon (or other) atom is replaced with one or more non-hydrogen substituents. Such substituents include, but not limited to, functional groups such as halogen, oxygen, hydroxyl, alkylthio, alkoxy, aryloxy, alkylcarbonyl, acyloxy, nitro, cyano, and the like.

The polymers of the present disclosure are comprised of repeated units having the general structure of formula (I)

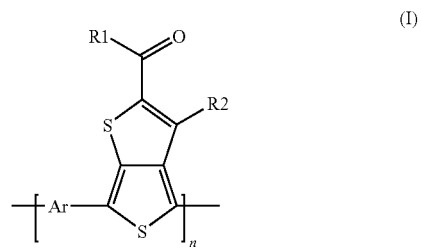

wherein: A1, A2, R1 and R2 are independently selected from proton, alkyl groups with up to 18 C atoms, alkoxy groups with up to 18 C atoms, cyano, nitro, aryls and substituted aryls.

Ar is selected from the group consisting of ethenylene, or ethynylene, or monocyclic, bicyclic and polycyclic arylene, or monocyclic, bicyclic and polycyclic heteroarylene, or may contain one to five, typically one to three such groups, either fused or linked.

In a polymer formula (I) are comprised of repeated units having the structure of formula (II)

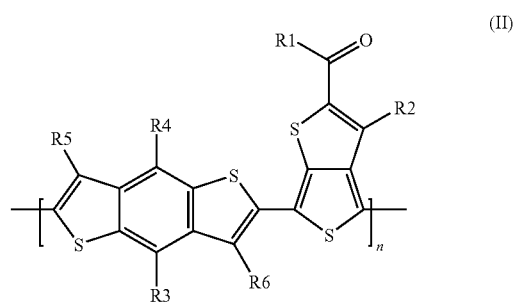

wherein: R1 is selected from proton, alkyls, substituted alkyls, aryls, substituted aryls; R2, R3, R4, R5 and R6 are selected independently from proton, alkyls, substituted alkyls, alkoxyls, substituted alkoxyls, halogens, aryls, substituted aryls.

In a specific polymer structure of formula (II), R5 and R6 are protons; R3, R4 and R1 are selected independently from alkyls, substituted alkyls, alkoxyls, substituted alkoxyls, aryls, substituted aryls; R2 is selected from proton, halogens, cyano.

In another embodiment polymers of formula (I) are comprised of repeated units having the structure of formula (III)

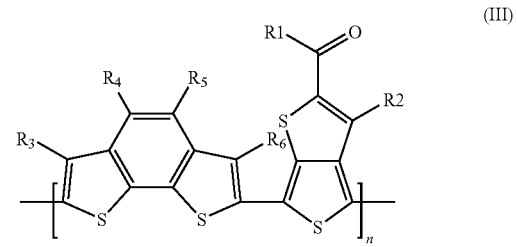

wherein: R1 is selected from proton, alkyls, substituted alkyls, aryls, substituted aryls; R2, R3, R4, R5 and R6 are selected independently from proton, alkyls, substituted alkyls, alkoxyls, substituted alkoxyls, halogens, aryls, substituted aryls.

In a specific polymer of formula (III), R3 and R6 are protons; R4, R5 and R1 are selected independently from alkyls, substituted alkyls, alkoxyls, substituted alkoxyls, aryls, substituted aryls; R2 is selected from proton, halogen atom, cyano.

Typically, the number average molecular weight of the polymers is in the range of approximately 1000 to 1,000,000, with ideal polymers having a number average molecular weight in the range of about 5000 to 500,000, and some ideal polymers having a number average molecular weight in the range of approximately 20,000 to 200,000. It will be appreciated that molecular weight can be varied to optimize polymer properties and the inventions of the present disclosure cover all molecular weights. For example, lower molecular weight can ensure solubility, while a higher molecular weight can ensure good film-forming properties.

Semiconductive compositions may be prepared that comprise a polymer of the present disclosure optionally combined with an admixer, typically a compound selected such that charge and/or energy transfer takes place between the admixer and the polymer when a excitation source including light or voltage is applied across the composition. For example, the admixer can be fullerene such as: $C_{60}$, $C_{70}$, or $C_{80}$, or some substituted fullerene compounds such as PCBM ([6,6]-phenyl $C_{61}$ butyric acid methyl ester) and PCBB ([6,6]-phenyl $C_{61}$ butyric acid butyl ester).

The polymers of the present disclosure are particularly useful as photovoltaic materials in photovoltaic devices such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present.

In practice, the present disclosure may employ conventional techniques of organic chemistry and polymer chemistry. In the following examples, efforts have been made to ensure accuracy with respect to numbers used, including amounts, temperature, reaction time, and the like, but some experimental error and deviation should be accounted for. Temperature used in the following examples is in degrees Celsius, and the pressure is at or near atmospheric pressure. All solvents were purchased as HPLC grade, and all reaction were routinely conducted under an inert atmosphere of argon. All reagents were obtained commercially unless otherwise indicated.

EXAMPLE 1

Synthesis of poly[4,8-bis(2-ethylhexoxy)-benzo[1,2-b:4,5-b']dithiophene-2,6-diyl-alt-2-(2-ethylhexanoyl)thieno[3,4-b]thiophene-4,6-diyl] (PBDTTT)

Synthesis procedure of one of the monomers of the polymer PBTTTT is shown in the following scheme.

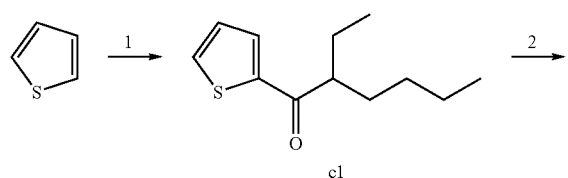

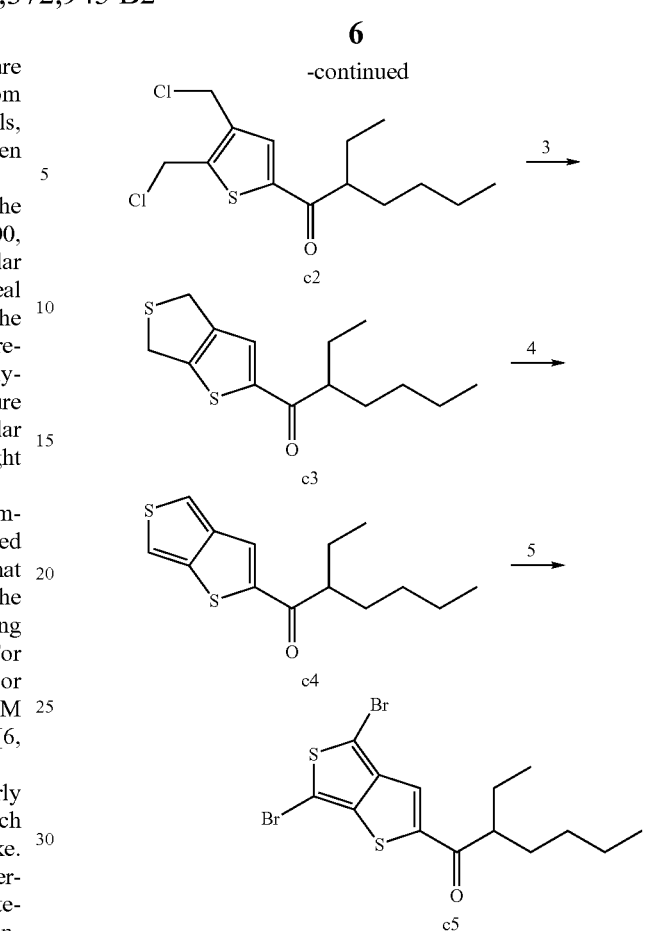

Step 1

Thiophene (1 mol, 84 g), 2-2-ethylhexanoyl chloride (1 mol, 162.5 g) and methylene chloride (500 ml) were put in one flask. Aluminum chloride powder (1 mol, 133.5 g) was added in small portions, during the addition, the reactant was kept below 0 degrees C. After completing the addition, the reactant was warm up slowly to ambient temperature and stirred for 30 min. Then, the reactant was poured into 1 Kg of cracked ice. The mixture was extracted by ethyl ether for several times, and the organic layers were combined and the volatile was removed under reduced pressure. The residual oil was purified by distillation and gave compound C1 as colorless oil (Yield 85-90%).

Step 2

Compound C1 (1.5 mol, 105 g) was mixed with methyl chloride methyl ether in a flask. Under ice-water bath, Stannum tetrachloride was added dropwisely. Then, the reactant was stirred at 0 degrees C. for two hours. Successively, the reactant was poured into ice and extracted by ethyl ether for several times and the organic layers were combined and the volatile was removed under reduced pressure. The residual oil was purified by silica gel column using hexane: ethyl acetate (10:1) as eluent and gave compound C2 as brown oil. Although there are unknown impurities, the purity of this compound is good enough to next step. (Yield 50%)

Step 3

Compound C2 (6.14 g, 20 mmol) and methanol (120 ml) was mixed in a flask and heated to reflux slightly. Then, a solution of 60% sodium sulfide (2.6 g, 20 mmol) and 60 ml methanol was added into the flask dropwisely. The reactant was stirred for 1 hour and methanol was removed. The residue was purified by silica gel column using hexane: ethyl acetate (8:1) as eluent and gave compound C3 as yellow oil. (Yield 60%)

Step 4

All of the compound C3 from last step was dissolved into 70 ml ethyl acetate and a solution of MCPBA (1.72 g, 10 mmol) in 40 ml ethyl acetate was added under −40 degrees C. very slowly. After the addition, the cooling bath was removed and the reactant was stirred under ambient temperature for 8 hours, and then the ethyl acetate was removed by reduced pressure and 30 ml of acetic anhydride was added. The reactant was heated to reflux for 1 hour. After removed acetate anhydride under vacuum, the residue was purified by silica gel column using hexane: methylene chloride (1:1) as eluent and gave compound C4 as yellow oil.

Step 5

Compound C4 (2.66 g, 10 mmol) was dissolved into 30 ml DMF under protect of argon. NBS (4.45 g, 25 mmol) was added in one portion. After 20 min of stirring, the reactant was poured into a cold solution of sodium thiosulfate and stirred for several minutes. Then, the mixture was extracted by ethyl ether and purified by silica gel column using hexane as eluent and gave compound C5 as pale yellow oil. (Yield 70%)

Synthesis of PBDTTT by Stille Coupling Reaction 2,6-bis(trimethyltin)-4,8-bis(2-ethylhexoxy)-benzo[1,2-b;3,4-b]-dithiophene (1 mmol, compound C5 (1 mmol), 20 ml of toluene and 2 ml of DMF were put into a two-necked flask with oil bath. The solution was flushed with argon for 10 minutes, then 30 mg of $Pd(PPh_3)_4$ were added into the flask. The solution was flushed again for 20 minutes. The oil bath was heated to 110 degrees C. carefully, and the reactant was stirred for 16 hours at this temperature under argon atmosphere. Then, the reactant was cooled to room temperature and the polymer was precipitated by addition of 100 ml methanol, and filtered through a Soxhlet thimble, which was then subjected to Soxhlet extraction with methanol, hexane, and chloroform. The polymer was recovered as a solid sample from the chloroform fraction by rotary evaporation. The solid was dried under vacuum for 1 day to get the final product.

EXAMPLE 2

Synthesis of poly[4,8-bis(2-ethylhexoxy)-benzo[1,2-b:4,5-b']dithiophene-2,6-diyl-alt-2-octanoyl-3-fluoro-thieno[3,4-b]thiophene-4,6-diyl] (PBDTTT-F)

Synthesis procedure of one of the monomers of the polymer PBTTTT-F is described as follows.

Step 1

3-Fluoro-4,6-dihydrothieno[3,4-b]thiophene-2-carboxylic acid prepared through the procedure described above (0.1 mmol, 20.4 g), copper power (5 g) and quinoline 50 ml mixed and heated to 200 degrees C. for one hour. The reactant was cooled down and filtered by suction. The filter residue was washed by hexanes several times and the filtrate was collected and washed by 300 ml of dilute hydrochloride acid 3 times. After removal the volatile solvent under vacuum, the residue oil was purified by silica gel column using petroleum ether as eluent. The compound D1 was obtained as colorless oil.

Step 2

Compound D1 (0.05 mol, 7.1 g), octanoyl chloride (0.05 mol, 8.1 g) and methylene chloride (50 ml) were put in one flask. Aluminum chloride powder (0.05 mol, 6.7 g) was added in small portions. During the addition, the reactant was kept below 0 degrees C. After completing the addition, the reactant was heated slowly to ambient temperature and stirred for 30 min. Then, the reactant was poured into 100 g of cracked ice. The mixture was extracted by ethyl ether several times, the organic layers were combined and the volatile was removed under reduced pressure. The residual oil was purified by silica gel column using petroleum ether:ethyl acetate (30:1, V/V) as eluent and gave compound D2 as colorless oil (Yield 85%).

Step 3

Compound D2 (10 mol, 1.94 g) from last step was dissolved into 70 ml ethyl acetate and a solution of MCPBA (1.72 g, 10 mmol) in 40 ml ethyl acetate was added under −40 degrees C. very slowly. After the addition, the cooling bath was removed and the reactant was stirred under ambient temperature for 8 hours. Then the ethyl acetate was removed by reduced pressure and 30 ml of acetic anhydride was added. The reactant was heated to reflux for 1 hour. After removal of the acetate anhydride under vacuum, the residue was purified by silica gel column using hexane: methylene chloride (1:1) as eluent and gave compound D3 as yellow oil.

Step 4

Compound D3 (2.66 g, 10 mmol) was dissolved into 30 ml DMF under protection of argon. NBS (4.45 g, 25 mmol) was added in one portion. After 20 min of stirring, the reactant was poured into a cold solution of sodium thiosulfate and stirred for several minutes. Then, the mixture was extracted by ethyl ether and purified by silica gel column using hexane as eluent and gave compound D4 as light orange oil. (Yield 70%)

Synthesis of PBDTTT-F by Stille Coupling Reaction 2,6-bis(trimethyltin)-4,8-bis(2-ethylhexoxy)-benzo[1,2-b;3,4-b]-dithiophene (1 mmol), compound D4 (1 mmol), 20 ml of toluene and 2 ml of DMF were put into a two-necked flask with oil bath. The solution was flushed with argon for 10 minutes, then 30 mg of Pd(PPh3)4 were added to the flask. The solution was flushed again for 20 minutes. The oil bath was heated to 110 degrees C. carefully, and the reactant was stirred for 16 hours at this temperature under argon atmosphere. Then, the reactant was cooled to room temperature and the polymer was precipitated by addition of 100 ml methanol, and filtered through a Soxhlet thimble, which was then subjected to Soxhlet extraction with methanol, hexane, and chloroform. The polymer was recovered as a solid sample from the chloroform fraction by rotary evaporation. The solid was dried under vacuum for 1 day to achieve the final product.

EXAMPLE 3

Polymer Solar Cell Devices Using PBDTTT as Electron Donor Material

PBDTTT (30 mg) was dissolved in chlorobenezene to make 20 mg $ml^{-1}$ solution, followed by blending with PCBM in 50 wt. %.

Polymer solar cell were fabricated on a transparent, indium-tin oxide (ITO) coated glass substrate. A thin layer of a conducting polymer, poly(styrenesulfonate) doped poly(3, 4-ethylenedioxy-thiophene) (PEDOT:PSS), was spin-coated onto the ITO surface for a better interface. The thickness of the PEDOT:PSS layer was about 30 nm, measured with Dektek profilometer. Then, a thin layer was spin-coated using the solution prepared above. Then, thin layers of calcium and aluminum were evaporated successively at pressure around $10^{-4}$ Pa. Testing was performed in a $N_2$ filled glove box under AM 1.5 G irradiation (100 mW cm$^{-2}$) using a Xenon lamp solar simulator calibrated with a silicon diode (with KG5 visible filter) calibrated in National Renewable Energy Laboratory (NREL).

The I-V curve of the polymer solar cell device was shown in FIG. 1.

EXAMPLE 4

Polymer Solar Cell Devices Using PBDTTT-F as Electron Donor Material

The same procedure as described in EXAMPLE 3 was used by using PBDTTT-F instead of PBDTTT as electron donor material in the polymer solar cell device.

Figure 2:
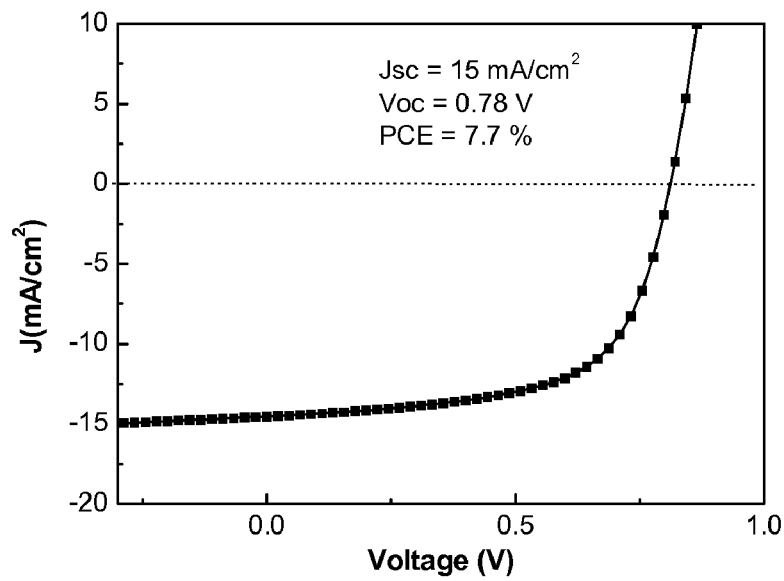
FIG. 2 is another I-V curve of a polymer solar cell with a structure of ITO/PEDOT:PSS/poly[4,8-bis(2-ethylhexoxy)-benzo[1,2-b:4,5-b']dithiophene-2,6-diyl-alt-2-(octanoyl)-3-fluoro-thieno[3,4-b]thiophene-4,6-diyl] (PBDTTT-F)/PCBM (1:1.5 wt/wt)/Ca/Al.

The I-V curve of the polymer solar cell device is shown in FIG. 2.

While the apparatus and method have been described in terms of what are presently considered to be the most practical and preferred embodiments, it is to be understood that the disclosure need not be limited to the disclosed embodiments. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A conjugated polymer having the structural formula

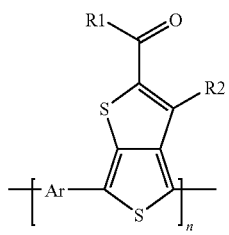

(I)

wherein R1 and R2 are independently selected from proton, halogens, alkyls, substituted alkyls, amino, N-substituted amino groups, aryls and substituted aryls; Ar is selected from the group consisting of ethenylene, or ethynylene, or monocyclic, bicyclic and polycyclic arylenes, or monocyclic, bicyclic and polycyclic heteroarylenes, or unit being comprised of two or more compounds choosing from ethenylene, ethynylene, or monocyclic, bicyclic and polycyclic arylene, or monocyclic, bicyclic and polycyclic heteroarylenes; n is the number of repeating units.

2. A conjugated polymer having the structural formula

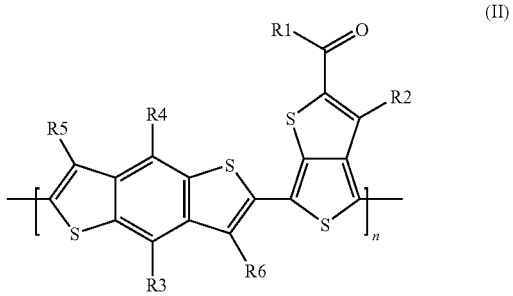

(II)

wherein R1 is selected from proton, alkyls, substituted alkyls, aryls, substituted aryls; R2, R3, R4, R5 and R6 are selected independently from proton, alkyls, substituted alkyls, alkoxyls, substituted alkoxyls, halogens, aryls, substituted aryls; n is the number of repeating units.

3. The conjugated polymer of claim 2, wherein R5 and R6 are protons; R1, R3 and R4 are independently selected from proton, alkyls, substituted alkyls, aryls, substituted aryls; R2 is selected from proton, alkyls, substituted alkyls, halogens.

4. The conjugated polymer of claim 1, wherein the conjugate polymer is used as photovoltaic material in one or more photovoltaic devices.

5. The conjugated polymer of claim 4, wherein the one or more photovoltaic devices are polymer solar cell devices or photodetector devices.

6. The conjugated polymer of claim 5, wherein the polymer solar cell devices has a bulk heterojunction structure.

7. The conjugated polymer of claim 6, wherein one of ingredients of the bulk heterojunction structure is fullerene or a fullerene derivative.

8. The conjugated polymer of claim 7, wherein one of the fullerene derivatives is [6,6]-phenyl $C_{61}$ butyric acid methyl ester or [6,6]-phenyl $C_{71}$ butyric acid methyl ester.

9. The conjugated polymer of claim 1, wherein the conjugated polymer is used as active layer material in one or more electronic devices.

10. The conjugated polymer of claim 9, wherein the one or more electronic devices are field effect transistors, light emitting devices, and sensors, electrochromic devices and capacitors.

11. The conjugated polymer of claim 2, wherein the conjugated polymer is used as photovoltaic material in one or more photovoltaic devices.

12. The conjugated polymer of claim 11, wherein the one or more photovoltaic devices are polymer solar cell devices or photodetector devices.

13. The conjugated polymer of claim 12, wherein the polymer solar cell devices has a bulk heterojunction structure.

14. The conjugated polymer of claim 13, wherein one of the ingredients of the bulk heterojunction structure is fullerene or fullerene derivative.

15. The conjugated polymer of claim 14, wherein one of the fullerene derivative is [6,6]-phenyl C61 butyric acid methyl ester or [6,6]-phenyl C71 butyric acid methyl ester.

16. The conjugated polymer of claim 2, wherein the conjugated polymer is used as active material in one or more electronic devices.

17. The conjugated polymer of claim 16, wherein the one or more electronic devices are field effect transistors, light emitting devices, and sensors, electrochromic devices and capacitors.

* * * * *